(12) United States Patent
Kurashima

(10) Patent No.: US 8,698,776 B2
(45) Date of Patent: Apr. 15, 2014

(54) ELECTROSTATIC CAPACITANCE-TYPE INPUT DEVICE, METHOD OF MANUFACTURING ELECTROSTATIC CAPACITANCE-TYPE INPUT DEVICE, AND ELECTRO-OPTICAL APPARATUS PROVIDED WITH INPUT FUNCTION

(75) Inventor: Takeshi Kurashima, Nagano (JP)

(73) Assignee: Japan Display West Inc., Chita-Gun, Aichi-Ken (JP)

( * ) Notice: Subject to any disclaimer, the term of this patent is extended or adjusted under 35 U.S.C. 154(b) by 657 days.

(21) Appl. No.: 12/908,142

(22) Filed: Oct. 20, 2010

(65) Prior Publication Data

US 2011/0095770 A1    Apr. 28, 2011

(30) Foreign Application Priority Data

Oct. 27, 2009  (JP) ................. P2009-246202

(51) Int. Cl.
*G06F 3/045* (2006.01)

(52) U.S. Cl.
USPC ............. 345/174; 324/679; 361/749

(58) Field of Classification Search
USPC ........................................ 324/679
See application file for complete search history.

(56) References Cited

U.S. PATENT DOCUMENTS

| | | | |
|---|---|---|---|
| 5,305,017 A * | 4/1994 | Gerpheide ................. 345/174 |
| 5,543,588 A * | 8/1996 | Bisset et al. .............. 178/18.06 |
| 5,880,411 A * | 3/1999 | Gillespie et al. .......... 178/18.01 |
| 7,030,860 B1 | 4/2006 | Hsu et al. |
| 8,456,851 B2 * | 6/2013 | Grunthaner ................ 361/749 |
| 2007/0015378 A1 * | 1/2007 | Huang ........................ 439/67 |
| 2008/0129317 A1 * | 6/2008 | Oba .............................. 324/663 |
| 2009/0213092 A1 * | 8/2009 | Kuo et al. ................... 345/174 |
| 2009/0256825 A1 * | 10/2009 | Klinghult et al. .......... 345/179 |
| 2009/0315857 A1 * | 12/2009 | Nishitani et al. ........... 345/174 |
| 2009/0321240 A1 * | 12/2009 | Huang et al. ................ 200/512 |
| 2009/0322705 A1 * | 12/2009 | Halsey, IV .................. 345/174 |
| 2010/0039269 A1 * | 2/2010 | Newham .................... 340/573.4 |
| 2010/0079387 A1 * | 4/2010 | Rosenblatt et al. ........ 345/173 |
| 2010/0102833 A1 * | 4/2010 | Uno et al. ................... 324/679 |
| 2010/0232171 A1 * | 9/2010 | Cannon et al. ............. 362/509 |
| 2010/0308846 A1 * | 12/2010 | Camus ........................ 324/679 |
| 2011/0012841 A1 * | 1/2011 | Lin .............................. 345/173 |
| 2011/0018560 A1 * | 1/2011 | Kurashima ................. 324/679 |
| 2011/0032193 A1 * | 2/2011 | Szalkowski ................ 345/173 |
| 2011/0037487 A1 * | 2/2011 | Fang et al. ................. 324/679 |
| 2011/0074447 A1 * | 3/2011 | Ootaka ....................... 324/679 |
| 2011/0075382 A1 * | 3/2011 | Mackey et al. ............. 361/749 |
| 2012/0313650 A1 * | 12/2012 | Kawaguchi et al. ....... 324/679 |

FOREIGN PATENT DOCUMENTS

JP    2003-511799    3/2003

* cited by examiner

*Primary Examiner* — Benjamin M Baldridge
(74) *Attorney, Agent, or Firm* — K&L Gates LLP

(57) ABSTRACT

An electrostatic capacitance-type input device includes: a translucent input device substrate that has a translucent position detecting electrode and a position detecting mount terminal electrically connected to the position detecting electrode on a first face side; a flexible wiring substrate that includes an overlapping portion overlapping with the first face side of the input device substrate and is electrically connected to the position detecting mount terminal in the overlapping portion; and a translucent shielding film that has a shield electrode layer and is disposed so as to overlap with a second face side of the input device substrate. The shielding film includes an extension portion that is folded back so as to overlap with the first face side of the input device substrate. The shielding film is electrically connected to the flexible wiring substrate through the extension portion.

9 Claims, 11 Drawing Sheets

ELECTROSTATIC CAPACITANCE-TYPE INPUT DEVICE, METHOD OF MANUFACTURING ELECTROSTATIC CAPACITANCE-TYPE INPUT DEVICE, AND ELECTRO-OPTICAL APPARATUS PROVIDED WITH INPUT FUNCTION

CROSS REFERENCES TO RELATED APPLICATIONS

The present application claims priority to Japanese Patent Application JP 2009-246202 filed on Oct. 27, 2009, the entire contents of which is hereby incorporated by reference.

BACKGROUND

The present disclosure relates to an electrostatic capacitance-type input device that detects an input position based on a change in the electrostatic capacitance coupled with an input position detecting electrode, a method of manufacturing the electrostatic capacitance-type input device, and an electro-optical apparatus provided with an input function including the electrostatic capacitance-type input device.

Among electronic apparatuses such as cellular phones, car navigation systems, personal computers, ticket-vending machines, and banking terminals, there are apparatuses, in which an input device termed a touch panel is arranged on the surface of an electro-optical panel such as a liquid crystal device, allowing a user to input information while referring to an image displayed in an image display area of the liquid crystal device. Among such input devices, electrostatic capacitance-type input devices monitor electrostatic capacitance that is coupled with each of a plurality of input position detecting electrodes formed on an input device substrate. Thus, when a finger is in proximity to any of the plurality of input position detecting electrodes, the electrostatic capacitance of the input position detecting electrode to which the finger is in proximity increases by the amount corresponding to electrostatic capacitance generated between the finger and the input position detecting electrode. Accordingly, the electrode to which the finger is in proximity can be specified.

Such electrostatic capacitance-type input devices detect a change in the capacitance coupled with the input position detecting electrode, and accordingly, can be easily influenced by electromagnetic wave noise penetrated from the side of the input device substrate that is opposite to the input operation side. Thus, electrostatic capacitance-type input devices in which a transparent shielding substrate or a substrate in which a shield electrode layer is formed is disposed on the side of the electrostatic capacitance-type input device that is opposite to the input operation side are proposed (see JP-T-2003-511799).

SUMMARY

However, in order to employ the shielding structure disclosed in JP-T-2003-511799, it is necessary to apply a shield electric potential to a flexible wiring substrate, with respect to a shielding substrate or a shield electrode layer, from the outside. Accordingly, according to the electrostatic capacitance-type input device, there is a problem in that it is necessary to dispose a flexible wiring substrate that is electrically connected to the shielding substrate or the shield electrode layer, in addition to the flexible wiring substrate electrically connected to the input device substrate. In particular, in a case where the shielding substrate or the shield electrode layer is positioned on a face of the input device substrate that is opposite to the input operation side on which the position detecting electrode is formed, there is a problem in that two flexible wiring substrates are used. Thus, when the shielding structure disclosed in JP-T-2003-511799 is employed, the process of connecting the flexible wiring substrate is performed twice, and accordingly, the production cost of the electrostatic capacitance-type input device is increased. In addition, since two flexible wiring substrates are used, the cost of the materials increases.

Thus, it is desirable to provide an electrostatic capacitance-type input device, a method of manufacturing an electrostatic capacitance-type input device, and an electro-optical apparatus provided with an input function capable of electrically connecting a common flexible wiring substrate to the position detecting electrode and the shield electrode that are disposed on opposite sides of the input device substrate.

According to an embodiment, there is provided an electrostatic capacitance-type input device including: a translucent input device substrate that has a translucent position detecting electrode and a position detecting mount terminal electrically connected to the position detecting electrode on a first face side; a flexible wiring substrate that includes an overlapping portion overlapping with the first face side of the input device substrate and is electrically connected to the position detecting mount terminal in the overlapping portion; and a translucent shielding film that has a shield electrode layer and is disposed so as to overlap with a second face side of the input device substrate. The shielding film includes an extension portion that is folded back so as to overlap with the first face side of the input device substrate, and the shielding film is electrically connected to the flexible wiring substrate through the extension portion.

According to the above-described electrostatic capacitance-type input device, a position detecting electrode is formed on the first face side of the input device substrate, and a shielding film having a shield electrode layer is disposed on the second face side in an overlapping manner. Accordingly, the above-described electrostatic capacitance-type input device can block the electromagnetic wave noise to be penetrated from the second face side of the input device substrate by using the shield electrode layer. In addition, according to the above-described electrostatic capacitance-type input device, when a shield electric potential is applied to the shield electrode layer, the extension portion of the shielding film is folded back so as to overlap with the first face side of the input device substrate. Thus, on the first face side of the input device substrate, the position detecting mount terminal of the input device substrate and the flexible wiring substrate are electrically connected to each other. Therefore, on the first face side of the input device substrate, the flexible wiring substrate and the shielding film can be electrically connected to each other through the extension portion. For example, a structure in which the extension portion of the shielding film is electrically connected to the flexible wiring substrate or a structure in which the extension portion of the shielding film is electrically connected to the flexible wiring substrate through a shielding mount terminal disposed on the input device substrate can be employed. Accordingly, a common flexible wiring substrate can be electrically connected to the position detecting electrode and the shield electrode that are disposed on opposite sides of the input device substrate. Thus, a shielding structure of the input device substrate can be implemented without incurring high cost.

In the above-described electrostatic capacitance-type input device, it is preferable that the shield electrode layer is exposed in the extension portion on the flexible wiring substrate side out of the input device substrate side and the flexible wiring substrate side, and the flexible wiring substrate overlaps with the extension portion so as to be electrically connected to the shield electrode layer. In other words, a structure in which the extension portion of the shielding film is electrically connected to the flexible wiring substrate is preferably employed. In such a configuration, when the flexible wiring substrate is electrically connected to the input device substrate, simultaneously, the flexible wiring substrate can be electrically connected to the extension portion of the shielding film.

In the above-described electrostatic capacitance-type input device, it is preferable that the shielding film includes an adhesive layer that bonds the shielding film to the second face side of the input device substrate, and the extension portion is bonded to the first face side of the input device substrate by the adhesive layer. In such a configuration, when the flexible wiring substrate is electrically connected to the extension portion of the shielding film, the extension portion of the shielding film can be fixed to the input device substrate. Accordingly, the flexible wiring substrate can be electrically connected to the extension portion of the shielding film easily and reliably.

In the above-described electrostatic capacitance-type input device, it is preferable that the shielding film has an insulating layer on a side of the shield electrode layer that is opposite to a side on which the input device substrate is positioned, and, in the extension portion, the shield electrode layer is exposed in an area in which the insulating layer is not formed. In such a configuration, even in a case where the shield electrode layer is covered with the insulating layer in the shielding film, the flexible wiring substrate can be electrically connected to the shield electrode layer that is positioned in the extension portion of the shielding film.

In the above-described electrostatic capacitance-type input device, it may be configured that the shield electrode layer is exposed in the extension portion on the input device substrate side out of the input device substrate side and the flexible wiring substrate side, and the input device substrate includes a shielding mount terminal that is electrically connected to both the shield electrode layer and the flexible wiring substrate. In such a configuration, the extension portion of the shielding film can be electrically connected to the flexible wiring substrate through the shielding mount terminal that is disposed on the input device substrate.

In such a case, it is preferable to employ a configuration in which the shield electrode layer is exposed by the area, in which an adhesive layer is not formed, in the extension portion in a case where the shielding film includes the adhesive layer that bonds the shielding film to the second face side of the input device substrate. In addition, it is preferable that the flexible wiring substrate and the extension portion do not overlap with each other on the first face side of the input device substrate.

In the above-described electrostatic capacitance-type input device, it is preferable that the shielding film has the extension portions in two places located on both sides pinching an arrangement area of the position detecting mount terminal. In such a configuration, the shielding film and the flexible wiring substrate can be electrically connected to each other in a reliable manner.

According to another embodiment, there is provided a method of manufacturing the above-described electrostatic capacitance-type input device. The method includes the steps of: pressing the flexible wiring substrate and the extension portion to the input device substrate by a press head in a state in which the flexible wiring substrate and the extension portion are overlapped on the first face side of the input device substrate; simultaneously performing an electrical connection between the position detecting mount terminal and the flexible wiring substrate and an electrical connection between the shield electrode layer and the flexible wiring substrate in the extension portion; and interposing an elastic member between the flexible wiring substrate and the extension portion and the press head. According to the above-described method, even in a case where there is a level difference due to a difference among the thickness of the shielding film, the thickness of the position detecting mount terminal of the input device substrate, and the thickness of the flexible wiring substrate, such a level difference can be absorbed by transformation of the elastic member. Therefore, the input device substrate, the flexible wiring substrate, and the extension portion of the shielding film can be electrically connected together in a reliable manner.

The electrostatic capacitance-type input device according to the embodiment of the present invention can be used, for example, for configuring an input function-added electro-optical apparatus. In the input function-added electro-optical apparatus, an electro-optical panel used for image generation is configured on a side of the substrate that is opposite to the input operation side. Such an input function-added electro-optical apparatus is used in an electronic apparatus such as a cellular phone, a car navigation system, a personal computer, a ticket-vending machine, and a banking terminal.

Additional features and advantages are described herein, and will be apparent from the following Detailed Description and the figures.

DETAILED DESCRIPTION

Figure 1A:
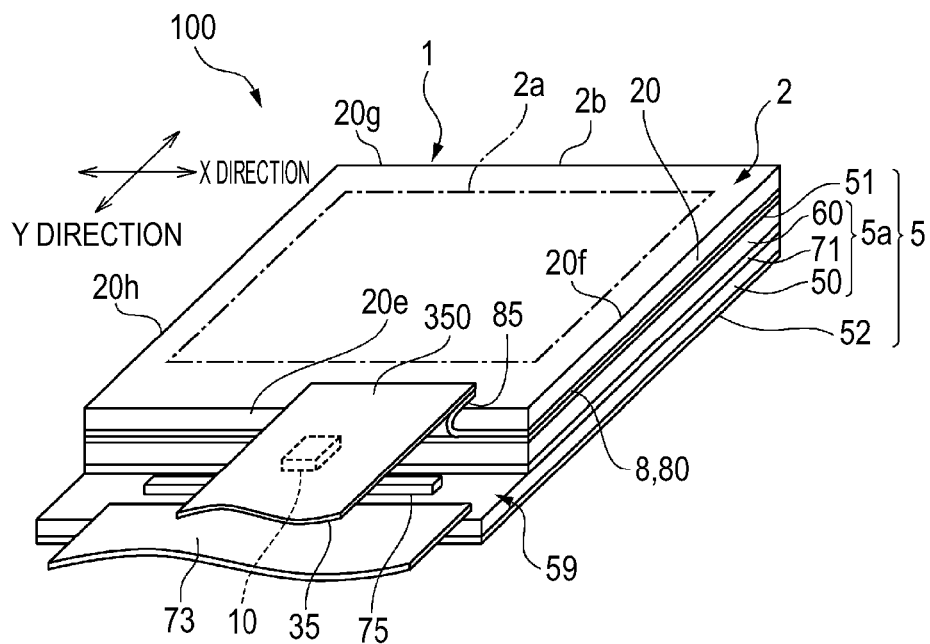
FIGS. 1A and 1B are schematic diagrams of an electro-optical apparatus provided with an input function according to Embodiment 1.

Embodiments will be described with reference to the accompanying drawings. In the drawings referred to in the description presented below, in order to allow each layer and each member to be of a size such that it is possible to recognize them in the drawings, the scales of the layers and the members are differently set. Hereinafter, after the basic configuration that is common to the embodiments has been described, each embodiment will be described in detail.

Embodiment 1

(Entire Configuration of Electro-Optical Apparatus Provided with Input Function)

Figure 1B:
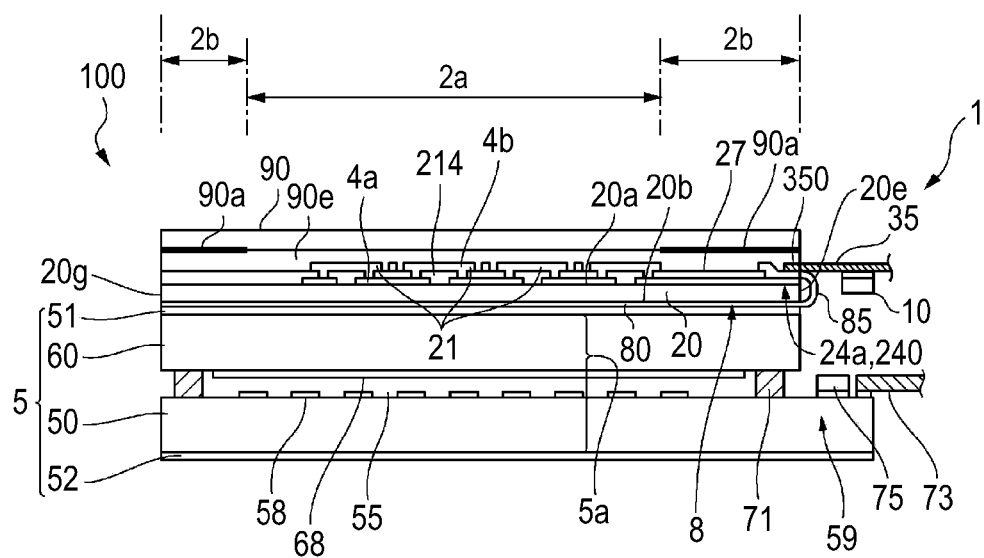
Figure 2A:
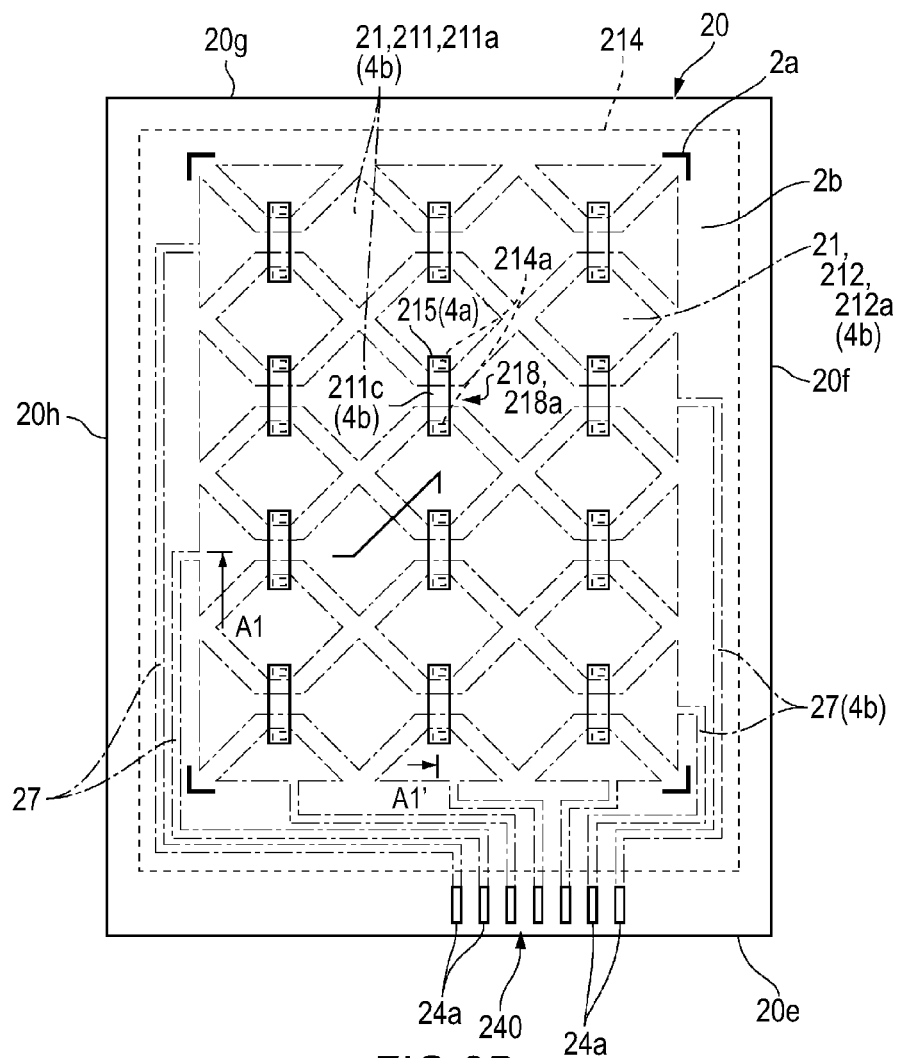
FIGS. 2A and 2B are schematic diagrams illustrating the configuration of an input device substrate of the electrostatic capacitance-type input device according to Embodiment 1.
Figure 2B:
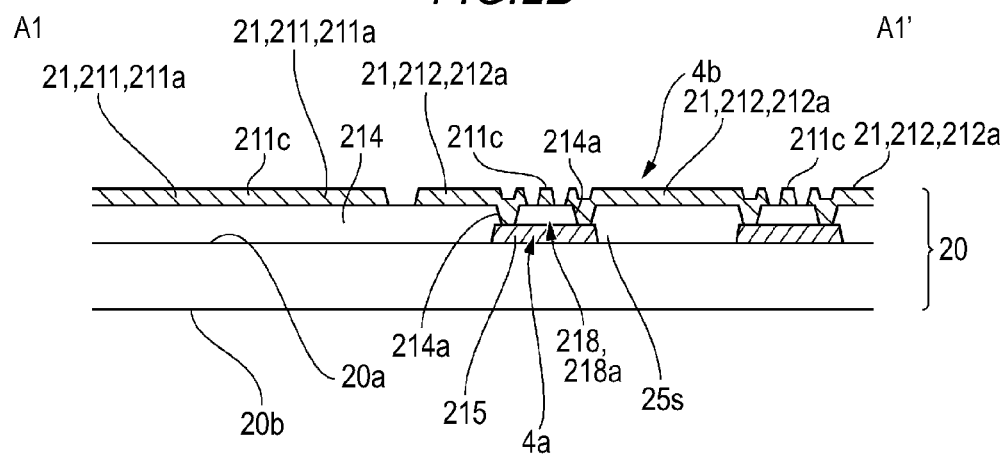

FIGS. 1A and 2B are schematic diagrams of an electro-optical apparatus provided with an input function according to Embodiment 1. FIG. 1A is a schematic diagram illustrating the outer appearance of the electro-optical apparatus provided with an input function, and FIG. 1B is a schematic diagram illustrating the cross-sectional configuration of the electro-optical apparatus provided with an input function. In FIG. 1A, a translucent cover is not shown.

As represented in FIGS. 1A and 1B, generally, the electro-optical apparatus provided with an input function 100 of this embodiment has an image generating device 5 that is configured by a liquid crystal device or the like and an electrostatic capacitance-type input device 1 that is disposed on a face of the image generating device 5, which emits display light, in an overlapping manner. The electrostatic capacitance-type input device 1 includes an input panel 2, and the image generating device 5 includes a liquid crystal panel serving as an electro-optical panel 5a (display panel). Both the input panel 2 and the electro-optical panel 5a have the planar shape of a rectangle, and the center area of the input panel 2 in the plan view is an input area 2a. In addition, an area of the electro-optical panel 5a that overlaps with the input area 2a in the plan view is an image forming area.

In the electrostatic capacitance-type input device 1, a flexible wiring substrate 35 is connected to a side on which an end portion 20e out of four end portions 20e to 20h of an input device substrate 20 used in the input panel 2 is positioned. In addition, a flexible wiring substrate 73 is connected to a side of the electro-optical panel 5a on which the end portion 20e is positioned. In the electrostatic capacitance-type input device 1, a control IC 10 used for detecting an input operation for the input panel 2 is electrically connected to the input device substrate 20 through the flexible wiring substrate 35.

In this embodiment, a shielding film 8 is disposed between the input panel 2 and the electro-optical panel 5a. The shielding film 8 has the function of blocking electromagnetic wave noise that is penetrated from an opposite side (the electro-optical panel 5a) of an input operation side of the input panel 2. The configuration of the shielding film 8 will be described later.

The image generating device 5 is an active matrix-type liquid crystal display device of transmission type or semi-transmission reflection type. On a side (a side opposite to the display light output side) of the electro-optical panel 5a that is opposite to a side on which the input panel 2 is disposed, a back light device (not shown in the figure) is disposed. The back light device, for example, has a light guiding plate, which has translucency, disposed on a side of the electro-optical panel 5a that is opposite to the side on which the input panel 2 is disposed in an overlapping manner and a light source such as a light emitting diode that emits white light or the like toward a side end portion of the light guiding plate. After light emitted from the light source is incident to the side end portion of the light guiding plate, the light is output toward the electro-optical panel 5a while propagating inside the light guiding plate. Between the light guiding plate and the electro-optical panel 5a, a sheet-shaped optical member such as a light scattering sheet or a prism sheet may be disposed.

In the image generating device 5, on the display light output side of the electro-optical panel 5a, a first polarizing plate 51 is disposed in an overlapping manner. In addition, on the opposite side of the electro-optical panel 5a, a second polarizing plate 52 is disposed in an overlapping manner. The first polarizing plate 51 and the second polarizing plate 52 are bonded to the electro-optical panel 5a by a translucent adhesive agent (not shown in the figure) such as an acrylic resin system. The electro-optical panel 5a includes a translucent opposing substrate 60 that is disposed on the display light output side (the input operation side) and a translucent component substrate 50 that is disposed to face the opposing substrate 60. The opposing substrate 60 and the component substrate 50 are bonded together by a rectangular frame-shaped sealing member 71, and a liquid crystal layer 55 is maintained within an area between the opposing substrate 60 and the component substrate 50 that is surrounded by the sealing member 71. On a face of the component substrate 50 that faces the opposing substrate 60, a plurality of pixel electrodes 58 are formed by a translucent conductive film such as an ITO (Indium Tin Oxide) film or an IZO (Indium Zinc Oxide) film. In addition, on a face of the opposing substrate 60 that faces the component substrate 50, a common electrode 68 is formed by a translucent conductive film such as an ITO film. When the image generating device 5 is the IPS (In Plane Switching) type or the FFS (Fringe Field Switching) type, the common electrode 68 is disposed on the component substrate 50 side. The component substrate 50 may be disposed on the display light output side of the opposing substrate 60. A driving IC 75 is built in an overhang area 59 of the component substrate 50 that overhangs from the edge of the opposing substrate 60 by using a COG ("chip on glass") technique, and the flexible wiring substrate 73 is bonded to the overhang area 59. On the component substrate 50, a driving circuit may be formed simultaneously with a switching device disposed on the component substrate 50.

(Configuration of Input Device 1)

The input panel 2 of the electrostatic capacitance-type input device 1 includes a translucent input device substrate 20 that is configured by a glass plate, a plastic plate, or the like and a translucent cover 90 having an insulating property. In this embodiment, a glass substrate is used as the input device substrate 20. In a case where the input device substrate 20 is formed from a plastic material, as the plastic material, a translucent sheet having heat resistance such as PET (polyethylene terephthalate), PC (polycarbonate), PES (poly ether sulphone), PI (polyimide), or cyclic olefin resin including polynorbornene may be used.

A substrate face of the input device substrate 20 that is positioned on the input operation side is a first face 20a, and a substrate face positioned on a side opposite to the input operation side is a second face 20b. On the first face 20a of the input device substrate 20, a lower layer-side conductive film 4a, an interlayer insulating film 214, and an upper layer-side conductive film 4b are formed from the lower layer side toward the upper layer side viewed from the input device substrate 20. An input position detecting electrode 21 is formed by the upper layer-side conductive film 4b out of the lower layer-side conductive film 4a and the upper layer-side conductive film 4b. In addition, a relay electrode 215 is formed by the lower layer-side conductive film 4a. In the end portion 20e of the input device substrate 20, a position detecting mount terminal 24a is formed on the first face 20a, and the flexible wiring substrate 35 is electrically connected to the position detecting mount terminal 24a.

To the first face 20a side of the input device substrate 20, a translucent cover 90 is attached by using an adhesive agent 90e or the like. In an area of the translucent cover 90 that overlaps with an outer area 2b of the input device substrate 20, a light shielding layer 90a having an insulating property is printed. An area that is surrounded by the light shielding layer 90a is an input area 2a. The light shielding layer 90a overlaps with the outer area of the electro-optical panel 5a and shields light leaking from the light source of the image generating device 5 or the end portion of the light guiding plate.

(Configuration of Input Device Substrate 20)

FIGS. 2A and 2B are schematic diagrams illustrating the configuration of the input device substrate 20 of the electrostatic capacitance-type input device 1 according to Embodiment 1. FIG. 2A is a plan view of the input device substrate 20, and FIG. 2B is a cross-sectional view thereof taken along line A1-A1'. In addition, in FIG. 2A, the lower layer-side conductive film 4a is denoted by a solid line, the interlayer insulating film 214 is denoted by a dotted line, and the upper layer-side conductive film 4b is denoted by a dashed dotted line. In addition, in FIG. 2A, the position of each corner portion of the input area 2a is denoted by a mark having a letter "L" shape.

As shown in FIGS. 2A and 2B, according to the electrostatic capacitance-type input device 1 of this embodiment, on the first face 20a side of the input device substrate 20, the lower layer-side conductive film 4a, the interlayer insulating film 214, and the upper layer-side conductive film 4b are sequentially formed from the lower layer side toward the upper layer side viewed from the input device substrate 20. In this embodiment, each of the lower layer-side conductive film 4a and the upper layer-side conductive film 4b is formed of a translucent conductive film having a film thickness of 10 nm to 40 nm such as an ITO film or an IZO film, and the interlayer insulating film 214 is a translucent insulating film having a film thickness of 200 nm to 600 nm that is formed of a silicon oxide film, a photosensitive resin film, or the like. On the entirety of the first face 20a of the input device substrate 20, a translucent underlying protection film that is formed of a silicon oxide film or the like may be formed. In such a case, the lower layer-side conductive film 4a, the interlayer insulating film 214, and the upper layer-side conductive film 4b are sequentially stacked on the underlying protection film. In order to configure such an electrostatic capacitance-type input device 1, the lower-layer side insulating film 4a, the interlayer insulating film 214, and the upper layer-side insulating film 4b are formed in predetermined patterns.

First, the upper layer-side conductive film 4b is formed as a plurality of rhombic areas in the input area 2a, and the rhombic areas configure pad portions 211a and 212a (large area portions) of the input position detecting electrodes 21 (the first input position detecting electrode 211 and the second input position detecting electrode 212). The pad portions 211a and 212a are alternately arranged in the X direction and the Y direction. Of the plurality of the pad portions 211a, the pad portions 211a that are adjacent to each other in the X direction (the first direction) are connected together through a connection portion 211c, and the pad portion 211a and the connection portion 211c configure the first input position detecting electrode 211 that extends in the X direction.

On the contrary, the plurality of the pad portions 212a configure the second input position detecting electrode 212 that extends in the Y direction (the second direction). However, a portion between the pad portions 212a that are adjacent to each other in the Y direction (a portion overlapping with the connection portion 211c) becomes a discontinued portion.

The upper layer-side conductive film 4b is formed as a plurality of wirings 27 extending from the input position detecting electrodes 21 (the first input position detecting electrode 211 and the second input position detecting electrode 212) in the outer area 2b of the input area 2a and is formed as a plurality of position detecting mount terminals 24a near the end portion 20e. The interlayer insulating film 214 is formed in the entirety of the input area 2a. In addition, the interlayer insulating film 214 is also formed on the outer area 2b of the input area 2a. In the interlayer insulating film 214, contact holes 214a are formed. The contact holes 214a are formed in positions that overlap with end portions of the pad portion 212a facing each other through a discontinued portion 218a. The lower layer-side conductive film 4a is formed as the relay electrode 215 in an area of the input area 2a overlapping with the contact hole 214a. In addition, the lower layer-side conductive film 4a is also formed in an area in which the wiring 27 and the position detecting mount terminal 24a are formed, and the wiring 27 and the position detecting mount terminal 24a have a two-layer structure of the lower layer-side conductive film 4a and the upper layer-side conductive film 4b. In the wiring 27, between the lower layer-side conductive film 4a and the upper layer-side conductive film 4b or in an upper layer of the upper layer-side conductive film 4b, a metal layer formed from chromium, silver, aluminum, a silver-aluminum alloy or the like may be formed. By employing such a multiple-layer structure, the wiring resistance of the wiring 27 can be decreased.

By overlapping the lower layer-side conductive film 4a, the interlayer insulating film 214, and the upper layer-side conductive film 4b that are configured as described above, a plurality of input position detecting electrodes 21 are formed on the inner side of the input area 2a. In this embodiment, the input position detecting electrodes 21 are configured by a plurality of rows of first input position detecting electrodes 211 extending in the X direction and a plurality of rows of second input position detecting electrodes 212 extending in the Y direction. The input position detecting electrodes 21 (the first input position detecting electrode 211 and the second input position detecting electrode 212) are formed in the same layer by the upper layer-side conductive film 4b out of the lower layer-side conductive film 4a and the upper layer-side conductive film 4b. Accordingly, on the first face 20a of the input device substrate 20, there are a plurality of intersection portions 218 of the first input position detecting electrodes 211 and the second input position detecting electrodes 212. Here, the first input position detecting electrode 211 is connected by a connection portion 211c, which is formed of the upper layer-side conductive film 4b, also in the intersection portion 218 so as to extend in the X direction. On the other hand, in the second input position detecting electrode 212, a discontinued portion 218a is configured in the intersection portion 218. However, in the intersection portion 218, the relay electrode 215 is formed in the lower layer of the interlayer insulating film 214. Thus, the relay electrode 215 electrically connects the pads 212a, which are adjacent to each other through the discontinued portion 218a, through the contact holes 214a of the interlayer insulating film 214. Accordingly, the second input position detecting electrode 212 is electrically connected in the Y direction. In addition, the relay electrode 215 overlaps with the connection portion 211c through the interlayer-insulating film 214. Accordingly, it is difficult for the relay electrode 215 to form a short circuit.

The first input position detecting electrode 211 and the second input position detecting electrode 212 configured as described above include rectangle-shaped pad portions 211a and 212a having a large area in an area pinched by the intersection portion 218, respectively. The connection portion 211c positioned in the intersection portion 218 of the first input position detecting electrode 211 is in the shape having a width smaller than that of the pad portions 211a and 212a. In addition, the relay electrode 215 is also formed in the shape having a width smaller than that of the pad portions 211a and 212a.

(Shielding Structure)

Figure 3A:
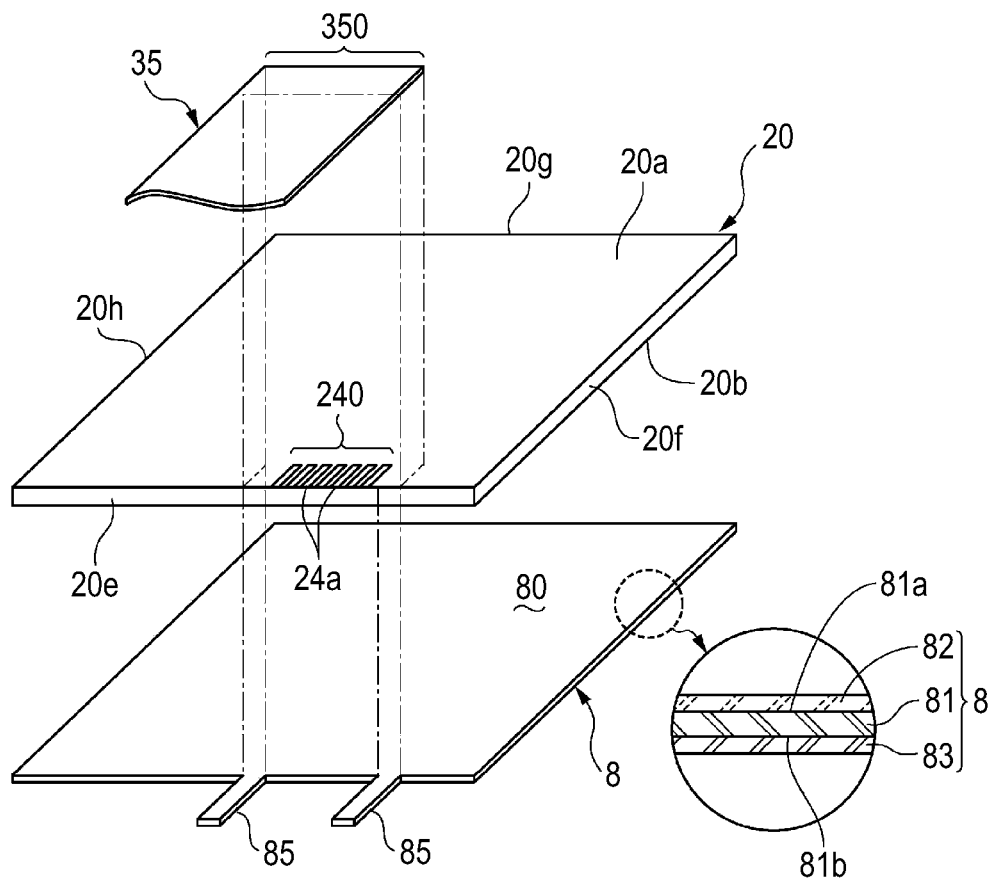
FIGS. 3A and 3B are schematic diagrams illustrating the electrostatic capacitance-type input device according to Embodiment 1.
Figure 3B:
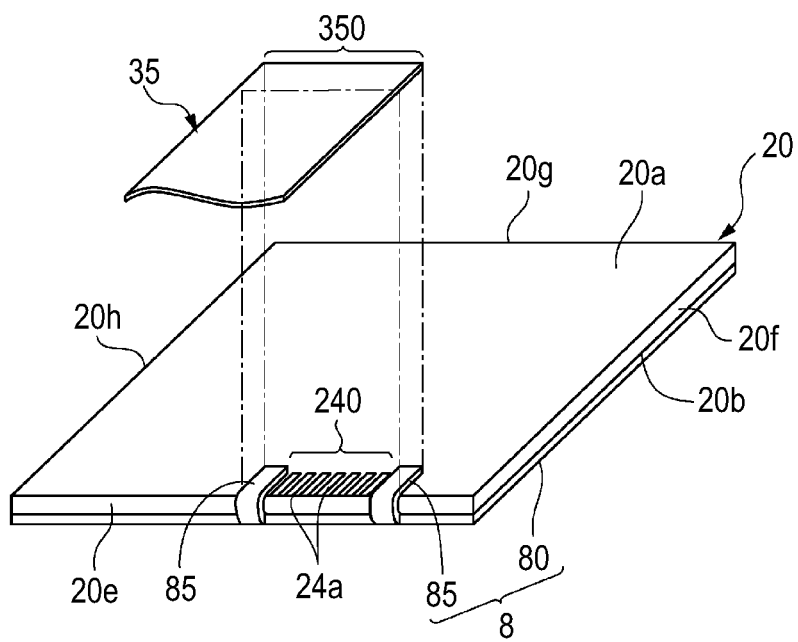

The electrical connection structure of the input device substrate 20, the flexible wiring substrate 35, and the shielding film 8 will be described with reference to FIGS. 3A and 3B, FIGS. 4A to 4C, and FIGS. 5A to 5D. FIGS. 3A and 3B are schematic diagrams illustrating the electrostatic capacitance-type input device 1 according to Embodiment 1. FIG. 3A is an exploded perspective view of the electrostatic capacitance-type input device 1, and FIG. 3B is an exploded perspective view showing the appearance of the electrostatic capacitance-type input device 1 immediately prior to mounting the flexible wiring substrate 35 to the input device substrate 20. In FIGS. 3A and 3B, the input position detecting electrode 21, the wiring 27, and the like are not shown.

Figure 4A:
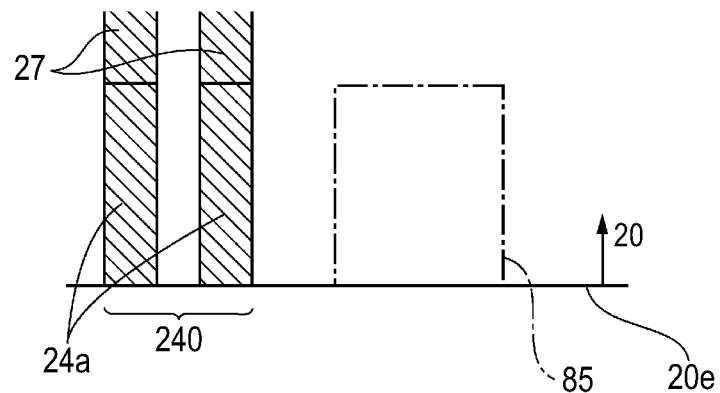
FIGS. 4A to 4C are schematic diagrams illustrating members of the electrostatic capacitance-type input device, which are electrically connected to each other, according to Embodiment 1.
Figure 4B:
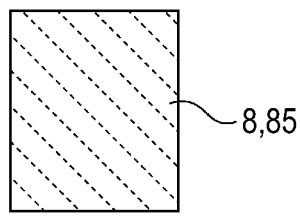
Figure 4C:
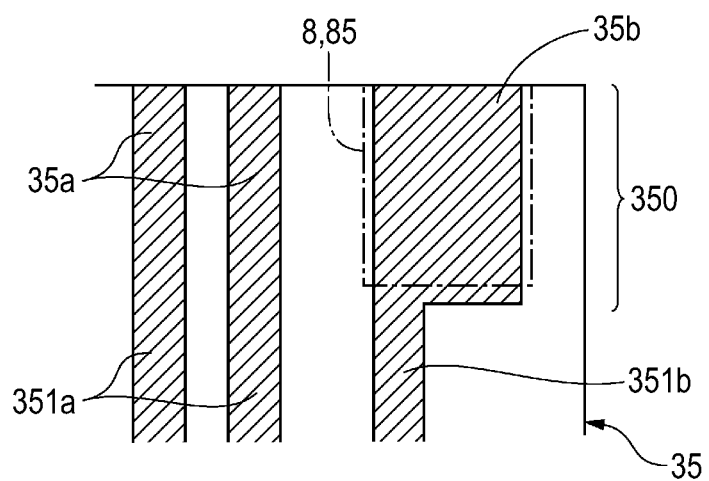

FIGS. 4A to 4C are schematic diagrams illustrating members of the electrostatic capacitance-type input device 1, which are electrically connected to each other, according to Embodiment 1 of the present invention. FIG. 4A is an enlarged schematic diagram illustrating the planar configuration of a terminal arrangement area of the input device substrate 20. FIG. 4B is an enlarged schematic diagram illustrating the planar configuration of an extension portion of the shielding film 8. FIG. 4C is an enlarged schematic diagram illustrating the planar configuration of the flexible wiring substrate 35. In FIGS. 4A and 4C, an area overlapping with the extension portion of the shielding film 8 is denoted by a dashed-dotted line.

Figure 5A:
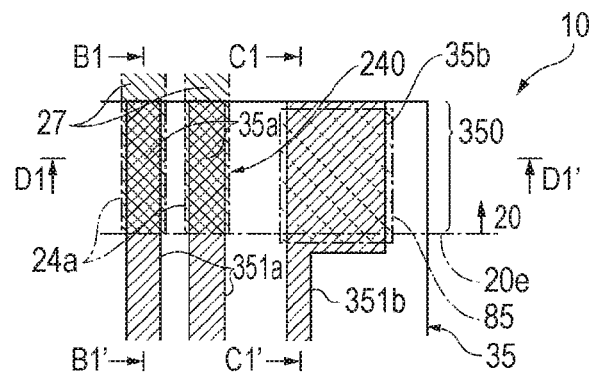
FIGS. 5A to 5D are schematic diagrams illustrating the periphery of a portion, in which a flexible wiring substrate is mounted to an input device substrate, of the electrostatic capacitance-type input device according to Embodiment 1.
Figure 5B:
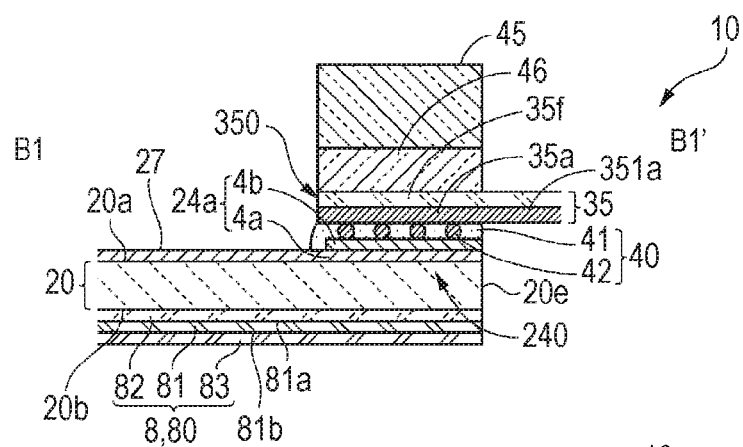
Figure 5C:
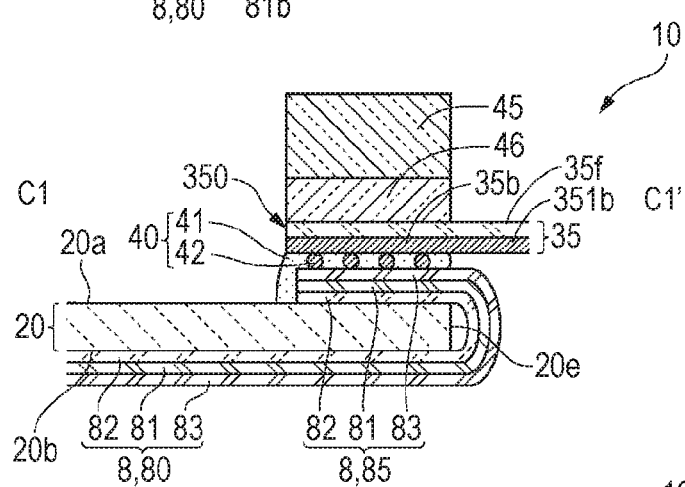
Figure 5D:
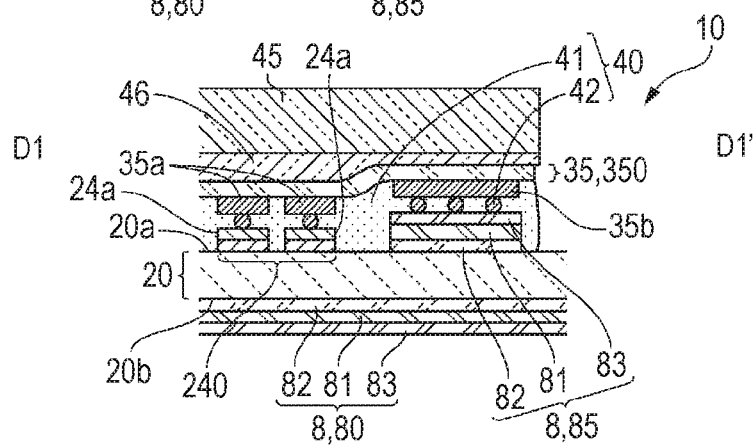

FIGS. 5A to 5D are schematic diagrams illustrating the periphery of a portion, in which the flexible wiring substrate 35 is mounted to the input device substrate 20, of the electrostatic capacitance-type input device 1 according to Embodiment 1. FIG. 5A is a plan view of the mounting portion of the input device substrate 20. FIGS. 5B, 5C, and 5D are cross-sectional views of the input device substrate 20 taken along line B1-B1', line C1-C1', and line D1-D1'. In FIGS. 5B, 5C, and 5D, a press head and the like that are used at the time of the mounting are shown. In FIG. 5A, the constituent elements of the flexible substrate 35 are denoted by solid lines, the constituent elements of the input device substrate 20 are denoted by dashed-dotted lines, and the extension portions of the shielding film 8 are denoted by dashed-two dotted lines.

As shown in FIGS. 1A and 1B, FIGS. 2A and 2B, and FIGS. 3A and 3B, according to the electrostatic capacitance-type input device 1 of this embodiment, a plurality of position detecting mount terminals 24a are formed together with the input position detecting electrode 21 and the wiring 27 (not shown in FIGS. 3A and 3B) on the first face 20a of the input device substrate 20. In addition, on the second face 20b of the input device substrate 20, a translucent shielding film 8 is disposed in an overlapping manner.

The shielding film 8 includes a translucent base material film 81 having a size for overlapping with the input device substrate 20, a translucent adhesive layer 82 that is formed on the entirety of one side 81a of the base material film 81 on which the input device substrate 20 is positioned, and a translucent shield electrode layer 83 that is formed on the entirety of the other side 81b of the base material film 81 that is a side opposite to the side on which the input device substrate 20 is positioned. The base material film 81 is configured by a resin film having an insulating property such as a PET film, and the adhesive layer 82 is configured by an adhesive layer having an insulating property such as an acrylic resin-based adhesive layer. The shield electrode layer 83 is configured by a translucent conductive film such as an ITO film or an IZO film. The shielding film 8 is bonded and fixed to the input device substrate 20 by the adhesive layer 82.

As shown in FIGS. 1A and 1B, FIGS. 2A and 2B, FIGS. 3A and 3B, FIG. 4A, and FIGS. 5A to 5D, on the first face 20a of the input device substrate 20, the terminal arrangement area 240 in which the plurality of position detecting mount terminals 24a are arranged along the end portion 20e is configured. As shown in FIGS. 1A and 1B, FIGS. 2A and 2B, FIGS. 3A and 3B, FIG. 4C, and FIGS. 5A to 5D, the flexible wiring substrate 35 includes the terminal arrangement area 240 of the input device substrate 20 and an overlapping portion 350 that overlaps with both side areas of the terminal arrangement area 240. In the overlapping portion 350, a terminal 35a is formed in an area overlapping with the position detecting mount terminal 24a, and the terminal 35a is formed from the end portion of a wiring 351a that is formed on the base material film 35f of the flexible wiring substrate 35. By performing a mounting process to be described later for the flexible wiring substrate 35, the position detecting mount terminal 24a and the terminal 35a of the flexible wiring substrate 35 are electrically connected to each other.

In this embodiment, as will be described below with reference to FIGS. 3A and 3B, FIGS. 4A to 4C, and FIGS. 5A to 5D, the flexible wiring substrate 35 is used for applying a shield electric potential to the shield electrode layer 83 of the shielding film 8. To be specific, first, the shielding film 8 includes a main body portion 80 having a large area that overlaps with the second face 20b of the input device substrate 20 and two extension portions 85 that extend from the main body portion 80 in a band shape. In any of the main body portion 80 and the extension portions 85, the adhesive layer 82 and the shield electrode layer 83 are formed. The two extension portions 85 are folded back up to the first face 20a side of the input device substrate 20 and overlap with both side areas of the terminal arrangement area 240 of the position detecting mount terminal 24a on the first face 20a of the input device substrate 20. In this state, in the extension portions 85, the adhesive layer 82 is positioned on the side on which the input device substrate 20 is positioned, and the shield electrode layer 83 is positioned on a side opposite to the side on which the input device substrate 20 is positioned. Accordingly, the extension portions 85 are bonded and fixed to the first face 20a of the input device substrate 20 by the adhesive layer 82. In addition, the main body portion 80 of the input device substrate 20 is bonded and fixed to the second face 20b of the input device substrate 20 by the adhesive layer 82.

Here, on the first face 20a of the input device substrate 20, no mount terminal is formed in both side areas (areas overlapping with the extension portions 85 of the shielding film 8) of the terminal arrangement area 240 of the position detecting mount terminal 24a. On the other hand, in areas (areas overlapping with the extension portions 85 of the shielding film 8) of the flexible wiring substrate 35 that overlap with both the side areas of the terminal arrangement area 240 of the position detecting mount terminal 24a, a terminal 35b is formed. The terminal 35b is formed from the end portion of a wiring 351b that is formed on the base material film 35f of the flexible wiring substrate 35.

When the input device substrate 20, the flexible wiring substrate 35, and the shielding film 8 that are configured as described above are used, by performing a mounting process to be described below, as shown in FIGS. 5B, 5C, and 5D, the terminal 35a of the flexible wiring substrate 35 and the position detecting mount terminal 24a of the input device substrate 20 can be electrically connected to each other by an anisotropic conductive member 40. In addition, the terminal 35b of the flexible wiring substrate 35 and the shield electrode layer 83 that is formed in the extension portions 85 of the shielding film 8 can be electrically connected to each other by the anisotropic conductive member 40.

(Manufacturing Method/Mounting Process of Electrostatic Capacitance-Type Input Device 1)

While the process of mounting the flexible wiring substrate 35 to the input device substrate 20 that is included in the manufacturing method of the electrostatic capacitance-type input device 1 of this embodiment is described with reference to FIGS. 3A and 3B, FIGS. 4A to 4C, and FIGS. 5A to 5D, the electrical connection structure of the shielding film 8 and the flexible wiring substrate 35 of the electrostatic capacitance-type input device 1 of this embodiment will be described.

In manufacturing the electrostatic capacitance-type input device 1 of this embodiment, in the mounting process, first, as shown in FIGS. 3A and 3B, the main body portion 80 of the shielding film 8 is bonded and fixed to the second face 20b of the input device substrate 20 by the adhesive layer 82, and the two extension portions 85 are folded back up to the first face 20a side of the input device substrate 20, and the extension portions 85 are bonded and fixed to the first face 20a of the input device substrate 20 by the adhesive layer 82.

Next, as shown in FIGS. 5B, 5C, and 5D, the terminal arrangement area 240 of the input device substrate 20 and the extension portions 85 of the shielding film 8 are coated with an anisotropic conductive member 40 having a liquid phase so as to be covered. Alternatively, the terminal arrangement area 240 of the input device substrate 20 and the extension portions 85 of the shielding film 8 overlap with an anisotropic conductive member 40 having a sheet shape so as to be covered. Such an anisotropic conductive member 40 has a composition in which conductive particles 42 are dispersed in a resin 41. Next, the end portion (overlapping portion 350) of the flexible wiring substrate 35 overlaps with the terminal arrangement area 240 of the input device substrate 20 and the extension portions 85 through the anisotropic conductive member 40 so as to cover the terminal arrangement area 240 and the extension portions 85.

Next, the flexible wiring substrate 35 is pressed to the input device substrate 20 while heating the flexible wiring substrate 35 by using the press head 45. At that time, an elastic member 46 such as a sheet of a fluorine resin system or the like is inserted between the press head 45 and the flexible wiring substrate 35. Next, the anisotropic conductive member 40 is solidified, and the flexible wiring substrate 35 is fixed to the terminal arrangement area 240 of the input device substrate 20 by using the anisotropic conductive member 40, and the extension portions 85 are fixed to the flexible wiring substrate 35 by using the anisotropic conductive member 40. Thereafter, the press head 45 and the elastic member 46 are detached.

As a result, the terminal 35a of the flexible wiring substrate 35 and the position detecting mount terminal 24a of the input device substrate 20 can be electrically connected to each other by the anisotropic conductive member 40. In addition, the terminal 35b of the flexible wiring substrate 35 and the shield electrode layer 83 that is formed in the extension portions 85 of the shielding film 8 can be electrically connected to each other by the anisotropic conductive member. Accordingly, the shield electrode layer 83 that is formed in the main body portion 80 of the shielding film 8 can be electrically connected to the terminal 35b of the flexible wiring substrate 35 and the wiring 351b through the extension portions 85. Therefore, the shield electric potential can be applied from the IC 10 shown in FIGS. 2A and 2B to the shield electrode layer 83.

(Input Position Detecting Operation and the Like)

As shown in FIG. 1B, in the electrostatic capacitance-type input device 1 of this embodiment, the IC 10 is connected to the position detecting mount terminal 24a of the input panel 2 through the flexible wiring substrate 35. Here, the IC 10 sequentially outputs a position detecting signal having a pulse pattern to the input device substrate 20 through the flexible wiring substrate 35. Accordingly, when there is no parasitic capacitance generated in the input position detecting electrode 21, a signal having the same waveform or an approximately same waveform as the position detecting signal having the pulse pattern output to the input device substrate 20 is detected by the IC 10.

On the contrary, when there is parasitic capacitance generated in the input position detecting electrode 21, distortion of the waveform occurs due to the capacitance. Accordingly, it can be detected whether or not the parasitic capacitance is generated in the input position detecting electrode 21. Therefore, in this embodiment, the position detecting signal is sequentially output to the plurality of the input position detecting electrodes 21 and monitors the electrostatic capacitance coupled with each input position detecting electrode 21. Thus, when a finger is in proximity to any of the plurality of the input position detecting electrodes 21, the electrostatic capacitance of the input position detecting electrode 21 to which the finger is in proximity increases by the amount corresponding to the electrostatic capacitance generated between the finger and the input position detecting electrode. Accordingly, the electrode to which the finger is in proximity can be specified.

When the above-described position detecting operation is performed, the IC 10 outputs the shield electric potential to the shielding film 8 through the flexible wiring substrate 35. Accordingly, when electromagnetic noise is to be penetrated into the input panel 2 from the electro-optical panel 5a that is positioned on the side of the input panel 2 (the input device substrate 20) opposite to the input operation side thereof, such electromagnetic wave noise is shielded by the shield electrode layer 83 of the shielding film 8. Therefore, it is difficult for a malfunction to occur due to the electromagnetic wave noise in the input panel 2.

(Main Advantages of this Embodiment)

As described above, according to the electrostatic capacitance-type input device 1 of this embodiment and the electro-optical apparatus provided with an input function 100 of this embodiment, when the shield electric potential is applied to the shield electrode layer 83, the extension portions 85 of the shielding film 8 are folded back so as to overlap with the first face 20a side of the input device substrate 20. Accordingly, on the first face 20a side of the input device substrate 20, the position detecting mount terminal 24a of the input device substrate 20 and the flexible wiring substrate 35 are electrically connected to each other. Therefore, a structure in which the extension portions 85 of the shielding film 8 are electrically connected to the flexible wiring substrate 35 on the first face 20a side of the input device substrate 20 can be employed.

In other words, in the shielding film 8 of this embodiment, the shield electrode layer 83 is exposed to the side of the flexible wiring substrate 35 in the extension portions 85. Accordingly, the shield electrode layer 83 of the extension portions 85 and the terminal 35b of the flexible wiring substrate 35 can be electrically connected directly to each other by the anisotropic conductive member 40. In addition, when the flexible wiring substrate 35 is electrically connected to the input device substrate 20, simultaneously, the flexible wiring substrate 35 can be electrically connected to the extension portions 85 of the shielding film 8. Thus, according to this embodiment, a shielding structure for the input device substrate 20 can be implemented without incurring high cost.

In addition, according to this embodiment, when an electrical connection between the position detecting mount terminal 24a and the flexible wiring substrate 35 and an electrical connection between the shield electrode layer 83 and the flexible wiring substrate 35 in the extension portions 85 are simultaneously performed by pressing the flexible wiring substrate 35 to the input device substrate 20 by the press head 45, an elastic member 46 is interposed between the flexible wiring substrate 35 and the extension portions 85 and the press head 45. Accordingly, even in a case where the thickness of the shielding film 8 and the thickness of the position detecting mount terminal 24a of the input device substrate 20 are different from each other on the first face 20a side of the input device substrate 20, such a difference in the thickness can be absorbed by transformation of the elastic member 46. Therefore, when the flexible wiring substrate 35 is electrically connected to the position detecting mount terminal 24a of the input device substrate 20, the flexible wiring substrate 35 can be electrically connected to the extension portions 85 of the shielding film 8 reliably.

In addition, the shielding film 8 includes the adhesive layer 82 that bonds the shielding film 8 to the second face 20b side of the input device substrate 20. Accordingly, the extension portions 85 can be bonded to the first face 20a side of the input device substrate 20 by the adhesive layer 82. Thus, when the flexible wiring substrate 35 is electrically connected to the extension portions 85 of the shielding film 8, the extension portions 85 of the shielding film 8 can be fixed to the input device substrate 20. Therefore, the flexible wiring substrate 35 can be electrically connected to the extension portions 85 of the shielding film 8 easily and reliably.

In addition, the shielding film 8 has the extension portions 85 in two places located on both sides pinching the terminal arrangement area 240 of the input device substrate 20. Accordingly, the shielding film 8 and the flexible wiring substrate 35 can be electrically connected to each other reliably.

Embodiment 2

Figure 6:
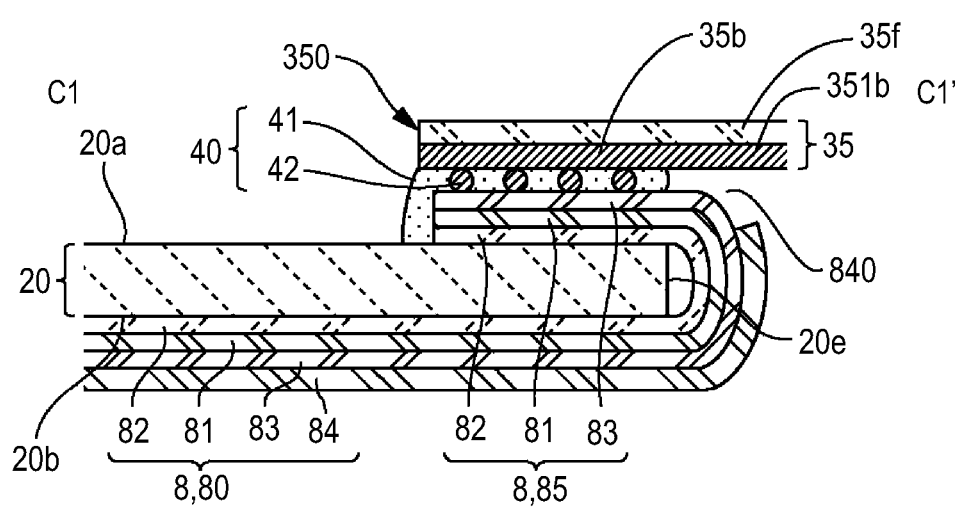
FIG. 6 is a schematic diagram illustrating an electrical connection structure between an extension portion of a shielding film and a flexible wiring substrate of the electrostatic capacitance-type input device according to Embodiment 2.

FIG. 6 is a schematic diagram illustrating an electrical connection structure between the extension portions 85 of the shielding film 8 and the flexible wiring substrate 35 of the electrostatic capacitance-type input device 1 according to Embodiment 2 of the present invention and corresponds to a cross-sectional view taken along line C1-C1' shown in FIG. 5C. The basic configuration of this embodiment is approximately the same as that of Embodiment 1. Thus, the same reference sign is assigned to each common portion, and the description thereof is omitted.

As shown in FIGS. 5A to 5D, similarly to Embodiment 1, in the electrostatic capacitance-type input device 1 of this embodiment, the shielding film 8 is disposed on the second face 20b side of the input device substrate 20 in an overlapping manner. The shielding film 8 includes a translucent base material film 81, an adhesive layer 82 that is formed on the entirety of one side 81a of the base material film 81 on which the input device substrate 20 is positioned, and a shield electrode layer 83 that is formed on the entirety of the other side 81b of the base material film 81 that is a side opposite to the side on which the input device substrate 20 is positioned. The base material film 81 is configured by a translucent resin film such as a PET film, and the adhesive layer 82 is configured by a translucent adhesive layer such as an acrylic resin-based adhesive layer. The shield electrode layer 83 is configured by a translucent conductive film such as an ITO film or an IZO film. The shielding film 8 is bonded and fixed to the input device substrate 20 by the adhesive layer 82.

In the shielding film 8 used in this embodiment, an insulating layer 84 (protection layer) is formed on a side of the shield electrode layer 83 that is opposite to a side on which the input device substrate 20 is positioned, and the shield electrode layer 83 is covered with the insulating layer 84.

When the shield electric potential is applied to the shield electrode layer 83 of the shielding film 8 having the above-described configuration, the extension portions 85 of the shielding film 8 are folded back so as to overlap with the first face 20a side of the input device substrate 20. Here, in the extension portions 85, the insulating layer 84 is not formed, and the shield electrode layer 83 is exposed by a non-forming area 840 of the insulating layer 84. Other configurations are the same as those of Embodiment 1.

In the electrostatic capacitance-type input device 1 configured as described above, similarly to Embodiment 1, when an electrical connection between the position detecting mount terminal 24a of the input device substrate 20 and the flexible wiring substrate 35 is made on the first face 20a side of the input device substrate 20 by the anisotropic conductive member 40, the shield electrode layer 83 exposed in the extension portions 85 and the terminal 35b of the flexible wiring substrate 35 can be electrically connected to each other by the anisotropic conductive member 40. Therefore, according to this embodiment, the same advantages as those of Embodiment 1 such as implementation of the shield structure for the input device substrate 20 without incurring high cost can be acquired.

Embodiment 3

(Entire Configuration of Electro-Optical Apparatus Provided with Input Function)

Figure 7A:
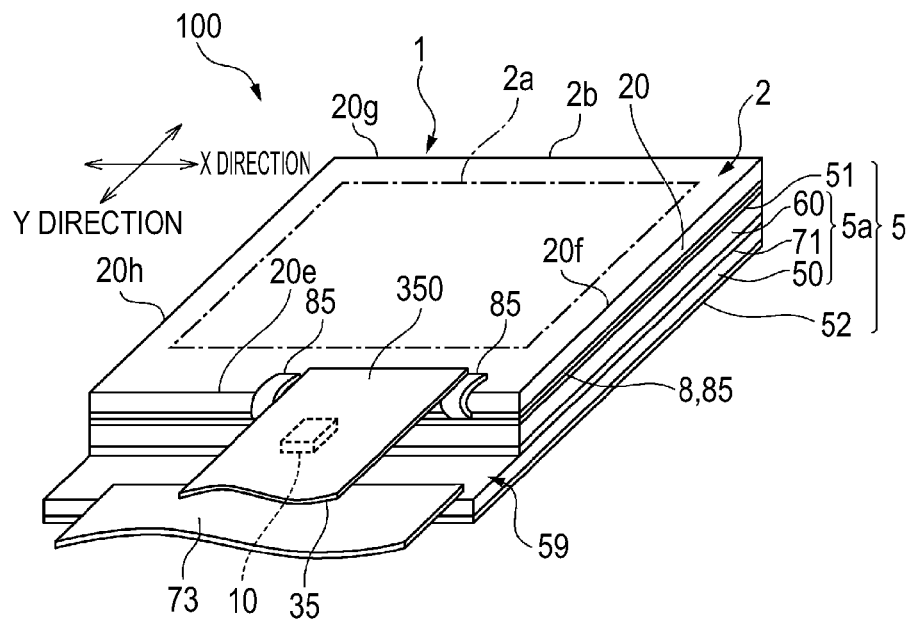
FIGS. 7A and 7B are schematic diagrams of an electro-optical apparatus provided with an input function according to Embodiment 3.
Figure 7B:
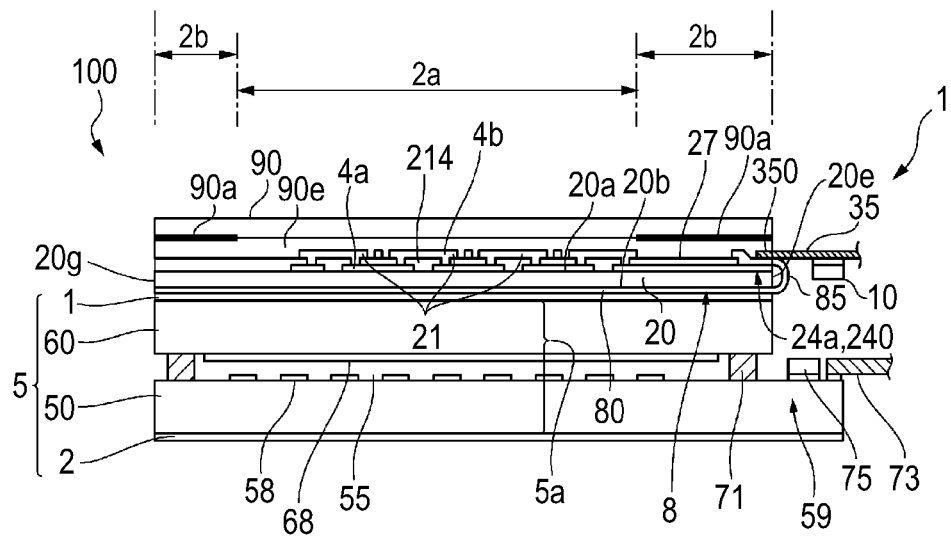

FIGS. 7A and 7B are schematic diagrams of an electro-optical apparatus provided with an input-function according to Embodiment 3. FIG. 7A is a schematic diagram illustrating the outer appearance of the electro-optical apparatus provided with an input function, and FIG. 7B is a schematic diagram illustrating the cross-sectional configuration of the electro-optical apparatus provided with an input function. In FIG. 7A, a translucent cover is not shown. The basic configuration of this embodiment is approximately the same as that of Embodiment 1. Thus, the same reference sign is assigned to each common portion, and the description thereof is omitted.

As represented in FIGS. 7A and 7B, the electro-optical apparatus provided with an input function 100 of this embodiment, similarly to that of Embodiment 1, has an image generating device 5 that is configured by a liquid crystal device or the like and an electrostatic capacitance-type input device 1 that is disposed on a face of the image generating device 5, which emits display light, in an overlapping manner.

The input panel 2 of the electrostatic capacitance-type input device 1 includes a translucent input device substrate 20 that is configured by a glass plate, a plastic plate, or the like. In this embodiment, a glass substrate is used as the input device substrate 20. On the first face 20a of the input device substrate 20 that is positioned on the input operation side, the lower layer-side conductive film 4a, the interlayer insulating film 214, and the upper layer-side conductive film 4b are formed from the lower layer side toward the upper layer side viewed from the input device substrate 20. The input position detection electrode 21 formed by the upper layer-side conductive film 4b out of the lower layer-side conductive film 4a and the upper layer-side conductive film 4b. In addition, in the end portion 20e of the input device substrate 20, a position detecting mount terminal 24a is formed on the first face 20a, and the flexible wiring substrate 35 is electrically connected to the position detecting mount terminal 24a.

(Shielding Structure)

Figure 8A:
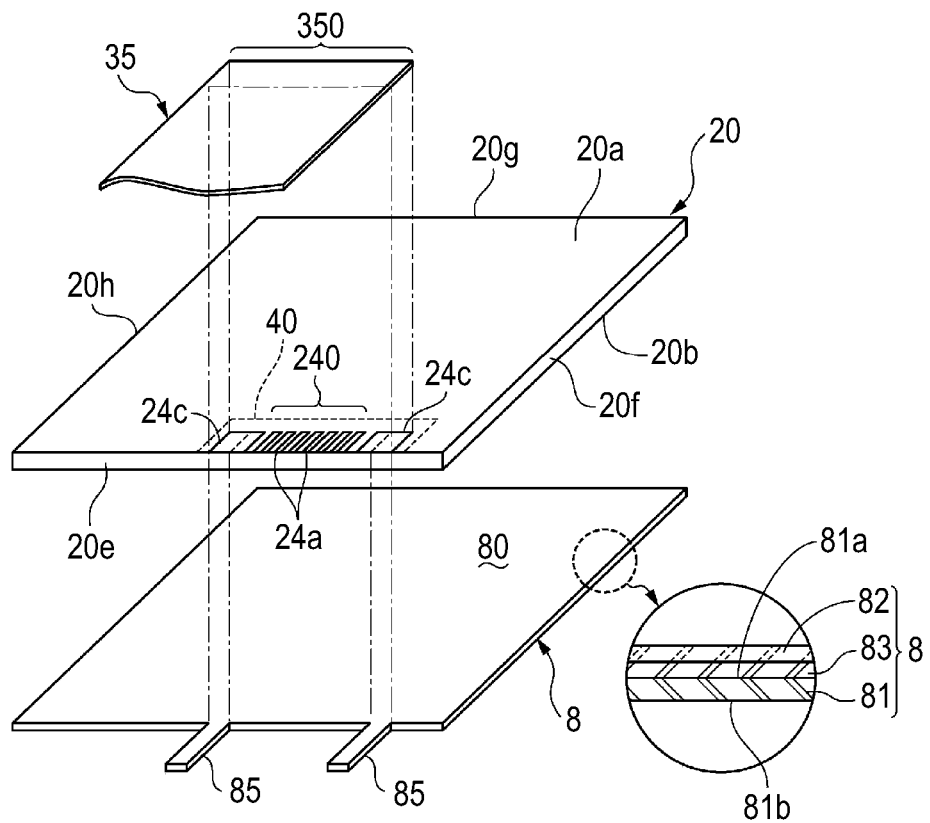
FIGS. 8A and 8B are schematic diagrams illustrating an electrostatic capacitance-type input device according to Embodiment 3.
Figure 8B:
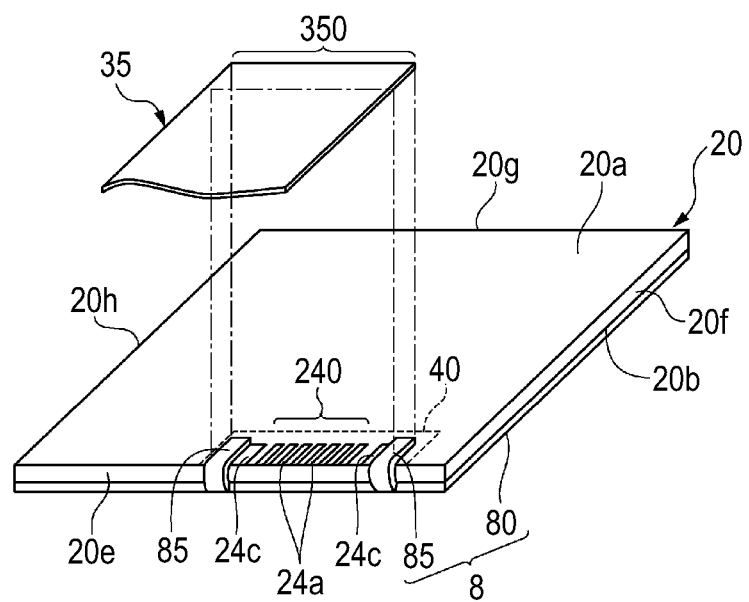

FIGS. 8A and 8B are schematic diagrams illustrating the electrostatic capacitance-type input device 1 according to Embodiment 3. FIG. 8A is an exploded perspective view of the electrostatic capacitance-type input device 1, and FIG. 8B is an exploded perspective view showing the appearance of the electrostatic capacitance-type input device 1 immediately prior to mounting the flexible wiring substrate 35 to the input device substrate 20. In FIGS. 8A and 8B, the input position detecting electrode 21, the wiring 27, and the like are not shown.

Figure 9A:
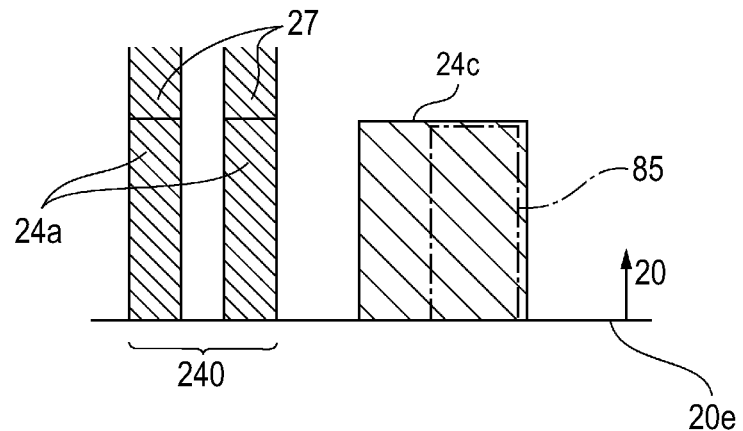
FIGS. 9A to 9C are schematic diagrams illustrating members of an electrostatic capacitance-type input device, which are electrically connected to each other, according to Embodiment 3.
Figure 9B:
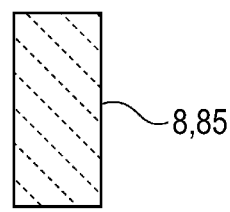
Figure 9C:
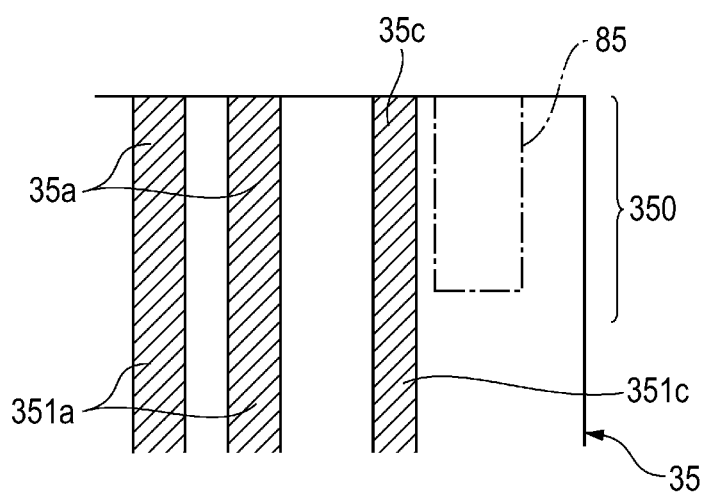

FIGS. 9A to 9C are schematic diagrams illustrating members of the electrostatic capacitance-type input device 1, which are electrically connected to each other, according to Embodiment 3. FIG. 9A is an enlarged schematic diagram illustrating the planar configuration of a terminal arrangement area of the input device substrate 20. FIG. 9B is an enlarged schematic diagram illustrating the planar configuration of an extension portion of the shielding film 8. FIG. 9C is an enlarged schematic diagram illustrating the planar configuration of the flexible wiring substrate 35. In FIGS. 9A and 9C, an area overlapping with the extension portion of the shielding film 8 is denoted by a dashed-dotted line.

Figure 10A:
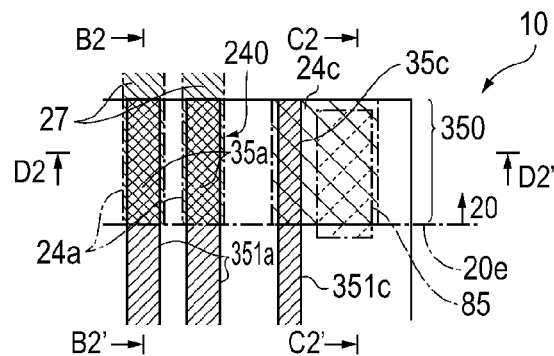
FIGS. 10A to 10D are schematic diagrams illustrating the periphery of a portion, in which a flexible wiring substrate is mounted to an input device substrate, of the electrostatic capacitance-type input device according to Embodiment 3.
Figure 10B:
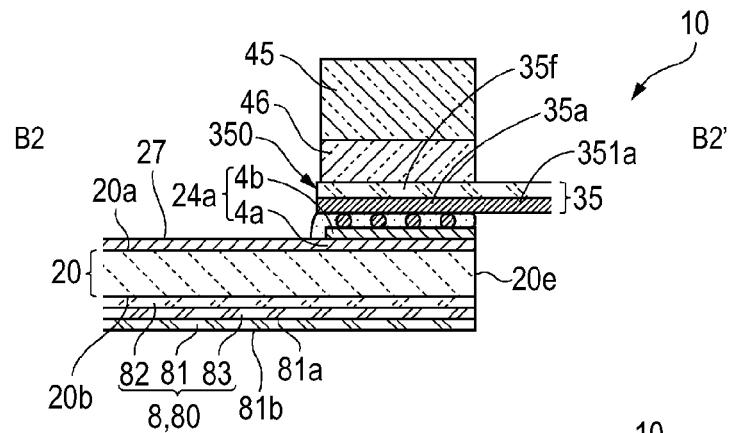
Figure 10C:
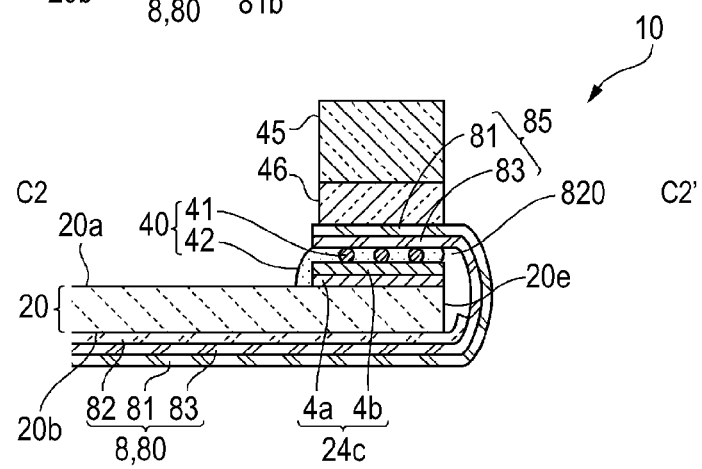
Figure 10D:
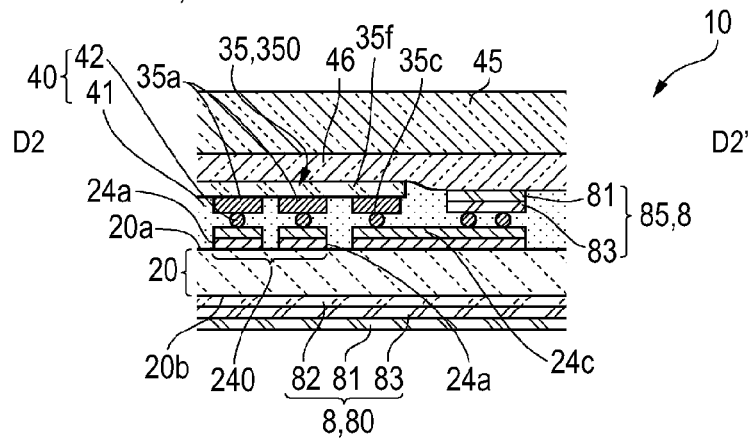

FIGS. 10A to 10D are schematic diagrams illustrating the periphery of a portion, in which the flexible wiring substrate 35 is mounted to the input device substrate 20, of the electrostatic capacitance-type input device 1 according to Embodiment 3. FIG. 10A is a plan view of the mounting portion of the input device substrate 20. FIGS. 10B, 10C, and 10D are cross-sectional views of the input device substrate 20 taken along line B2-B2', line C2-C2', and line D2-D2'. In FIG. 10A, the constituent elements of the flexible substrate 35 are denoted by solid lined, the constituent elements of the input device substrate 20 are denoted by dashed-dotted lines, and the extension portions of the shielding film 8 are denoted by dashed-two dotted lines.

In this embodiment, a shielding film 8 is disposed between the input panel 2 and the electro-optical panel 5a. The shielding film 8 has the function of blocking electromagnetic wave noise that is penetrated from an opposite side (the electro-optical panel 5a) of an input operation side of the input panel 2.

In this embodiment, the shielding film 8, differently from Embodiment 1, includes a translucent base material film 81 having a size for overlapping with the input device substrate 20, a shield electrode layer 83 that is formed on the entirety of the one side 81a of the base material film 81 on which the input device substrate 20 is positioned, and an adhesive layer 82 that is formed on the entirety of a face of the shield electrode layer 83 opposite to a side on which the base material film 81 is positioned. In addition, on the other side 8 1b of the base material film 81, the shield electrode layer 83 is not formed. The base material film 81 is configured by a translucent resin film such as a PET film, and the adhesive layer 82 is configured by a translucent adhesive layer such as an acrylic resin-based adhesive layer. The shield electrode layer 83 is configured by a translucent conductive film such as an ITO film or an IZO film. The shielding film 8 is bonded and fixed to the input device substrate 20 by the adhesive layer 82.

As shown in FIGS. 7A and 7B, FIGS. 8A and 8B, FIG. 9A, and FIGS. 10A to 10D, on the first face 20a of the input device substrate 20, the terminal arrangement area 240 in which the plurality of position detecting mount terminals 24a are arranged along the end portion 20e is configured. As shown in FIGS. 7A and 7B, FIGS. 8A and 8B, FIG. 9A, and FIGS. 10A to 10D, the flexible wiring substrate 35 includes the terminal arrangement area 240 of the input device substrate 20 and an overlapping portion 350 that overlaps with both side areas of the terminal arrangement area 240. In the overlapping portion 350, a terminal 35a is formed in an area overlapping with the position detecting mount terminal 24a.

In this embodiment, as will be described below with reference to FIGS. 7A and 7B, FIGS. 8A to 8B, and FIGS. 9A to 9C, and FIGS. 10A to 10D, the flexible wiring substrate 35 is used for applying a shield electric potential to the shield electrode layer 83 of the shielding film 8. To be specific, first, the shielding film 8 includes a main body portion 80 having a large area that overlaps with the second face 20b of the input device substrate 20 and two extension portions 85 that extend from the main body portion 80 in a band shape.

Here, in the main body portion 80, an adhesive layer 82 and a shield electrode layer 83 are formed. The main body portion 80 is bonded and fixed to the first face 20a of the input device substrate 20 by the adhesive layer 82. On the other hand, the adhesive layer 82 is not formed in the extension portions 85, and the shield electrode layer 83 is exposed in a non-forming area 820 of the adhesive layer 82. The two extension portions 85 are folded back up to the first face 20a side of the input device substrate 20 and overlap with both side areas of the terminal arrangement area 240 of the position detecting mount terminal 24a on the first face 20a of the input device substrate 20. In this state, in the extension portions 85, the shield electrode layer 83 is exposed on the side on which the input device substrate 20 is positioned.

Here, on the first face 20a of the input device substrate 20, a shielding mount terminal 24c is formed in both side areas of the terminal arrangement area 240 of the position detecting mount terminal 24a. In addition, the extension portion 85 of the shielding film 8 is electrically connected to the shield electrode layer 83 by the anisotropic conductive material 40 in the state in which the extension portion 85 overlaps the shielding mount terminal 24c. Here, only a part of the shielding mount terminal 24c overlaps with the extension portion 85 of the shielding film 8, and the other portion of the shielding mount terminal 24c is electrically connected to the terminal 35c of the flexible wiring substrate 35 by the anisotropic conductive member 40. In other words, on the flexible wiring substrate 35, the terminal 35c is formed in an area overlapping with both side areas of the terminal arrangement area 240 of the position detecting mount terminal 24a. The terminal 35c is formed only in an area, which does not overlap with the extension portion 85, out of the area of the input device substrate 20 that overlaps with the shielding mount terminal 24c. As described above, in this embodiment, the flexible wiring substrate 35 does not overlap with the extension portion 85. The terminal 35c is formed from the end portion of the wiring 351c that is formed on the base material film 35f of the flexible wiring substrate 35.

When the input device substrate 20, the flexible wiring substrate 35, and the shielding film 8 that are configured as described above are used, by performing a mounting process to be described below, as shown in FIGS. 10B, 10C, and 10D, the terminal 35a of the flexible wiring substrate 35 and the position detecting mount terminal 24a of the input device substrate 20 can be electrically connected to each other by an anisotropic conductive member 40. In addition, the terminal 35c of the flexible wiring substrate 35 and the shielding mount terminal 24c of the input device substrate 20 can be electrically connected to each other by the anisotropic conductive member 40. Furthermore, the shielding mount terminal 24c of the input device substrate 20 and the shield electrode layer 83 that is formed in the extension portion 85 of the shielding film 8 can be electrically connected to each other by the anisotropic conductive member 40.

(Manufacturing Method/Mounting Process of Electrostatic Capacitance-Type Input Device 1)

While the process of mounting the flexible wiring substrate 35 to the input device substrate 20 that is included in the manufacturing method of the electrostatic capacitance-type input device 1 of this embodiment is described with reference to FIGS. 8A and 8B and FIGS. 10A to 10D, the electrical connection structure of the shielding film 8 and the flexible wiring substrate 35 of the electrostatic capacitance-type input device 1 of this embodiment will be described.

In manufacturing the electrostatic capacitance-type input device 1 of this embodiment, in the mounting process, first, as shown in FIG. 8A, an anisotropic conductive member 40 is disposed in the terminal arrangement area 240 and both side areas thereof on the first face 20a of the input device substrate 20.

Next, as shown in FIG. 8B, the main body portion 80 of the shielding film 8 is bonded and fixed to the second face 20b of the input device substrate 20 by the adhesive layer 82, and two extension portions 85 are folded back up to the first face 20a side of the input device substrate 20, and the extension portions 85 overlap the shielding mount terminal 24c of the input device substrate 20.

Next, as shown in FIGS. 10B, 10C, and 10D, next, the end portion (the overlapping portion 350) of the flexible wiring substrate 35 is overlapped so as to cover the terminal arrangement area 240 of the input device substrate 20 and the extension portions 85 through the anisotropic conductive material 40.

Next, the flexible wiring substrate 35 is pressed to the input device substrate 20 while heating the flexible wiring substrate 35 by using the press head 45. At that time, the extension portions 85 are also pressed to the input device substrate 20 by the press head 45. Here, an elastic member 46 termed a sheet of a fluorine resin system or the like is inserted between the press head 45 and the flexible wiring substrate 35 and the press head 45 and the extension portions 85. Next, the anisotropic conductive member 40 is solidified, and the flexible wiring substrate 35 is fixed to the terminal arrangement area 240 of the input device substrate 20 by using the anisotropic conductive member 40, and the extension portions 85 are fixed to the input device substrate 20 by using the anisotropic conductive member 40.

As a result, the terminal 35a of the flexible wiring substrate 35 and the position detecting mount terminal 24a of the input device substrate 20 can be electrically connected to each other by the anisotropic conductive member 40. In addition, the terminal 35c of the flexible wiring substrate 35 and the shielding mount terminal 24c of the input device substrate 20 can be electrically connected to each other by the anisotropic conductive member 40. Furthermore, the shielding mount terminal 24c of the input device substrate 20 and the shield electrode layer 83 that is formed in the extension portion 85 of the shielding film 8 can be electrically connected to each other by the anisotropic conductive member. Therefore, the shield electric potential can be applied from the IC 10 shown in FIGS. 7A and 7B to the shield electrode layer 83.

(Main Advantages of this Embodiment)

As described above, according to the electrostatic capacitance-type input device 1 of this embodiment and the electro-optical apparatus provided with an input function 100 of this embodiment, when the shield electric potential is applied to the shield electrode layer 83, the extension portions 85 of the shielding film 8 are folded back so as to overlap with the first face 20a side of the input device substrate 20. Accordingly, on the first face 20a side of the input device substrate 20, the position detecting mount terminal 24a of the input device substrate 20 and the flexible wiring substrate 35 are electrically connected to each other. Therefore, a structure in which the extension portions 85 of the shielding film 8 are electrically connected to the flexible wiring substrate 20 through the shielding mount terminal 24c of the input device substrate 20 can be employed. Thus, according to this embodiment, a shielding structure for the input device substrate 20 can be implemented without incurring high cost.

In addition, according to this embodiment, when an electrical connection between the position detecting mount terminal 24a and the flexible wiring substrate 35 and an electrical connection between the shield electrode layer 83 and the flexible wiring substrate 35 in the extension portion 85 are simultaneously performed by pressing the flexible wiring substrate 35 to the input device substrate 20 by the press head 45, an elastic member 46 is interposed between the flexible wiring substrate 35 and the extension portion 85 and the press head 45. Accordingly, even in a case where the thickness of the shielding film 8 and the thickness of the flexible wiring substrate 35 are different from each other on the first face 20a side of the input device substrate 20, such a difference in the thickness can be absorbed by transformation of the elastic member 46. Therefore, the input device substrate 20, the position detecting mount terminal 24a, and the flexible wiring substrate 35 can be electrically connected in a reliable manner.

Furthermore, the shielding film 8 includes the extension portions 85 in two places on both sides pinching the terminal arrangement area 240 of the input device substrate 20. Accordingly, the shielding film 8 and the flexible wiring substrate 35 can be electrically connected in a reliable manner.

Other Embodiments

In the above-described embodiments, two extension portions 85 are disposed in the shielding film 8. However, the number of the extension portions 85 may be one or three or more. In addition, in the above-described embodiments, a liquid crystal device is used as the image generating device 5. However, as the image generating device 5, an organic electroluminescent device may be used. In addition, in the above-described embodiments, the input panel 2 and the electro-optical panel 5a have planar rectangle shapes. However, the input panel 2 and the electro-optical panel 5a may have planar polygon shapes such as a pentagon. In addition, it may be configured that the electro-optical panel 5a has a planar rectangle shape, and the input panel 2 has a planar polygon shape having a size larger than that of the electro-optical panel 5a.

[Example of Mounting in Electronic Apparatus]

Figure 11A:
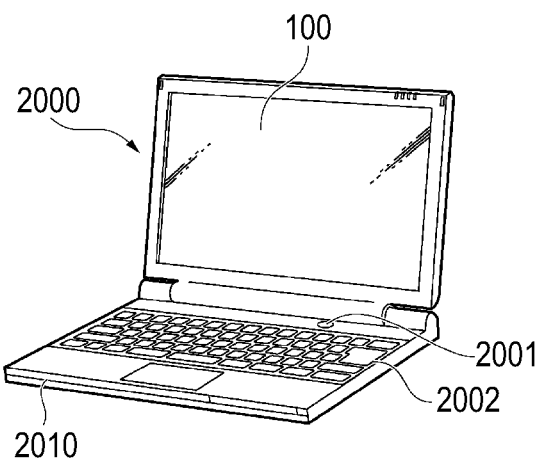
FIGS. 11A to 11C are schematic diagrams of electronic apparatuses including an electro-optical apparatus provided with an input function according to an embodiment.
Figure 11B:
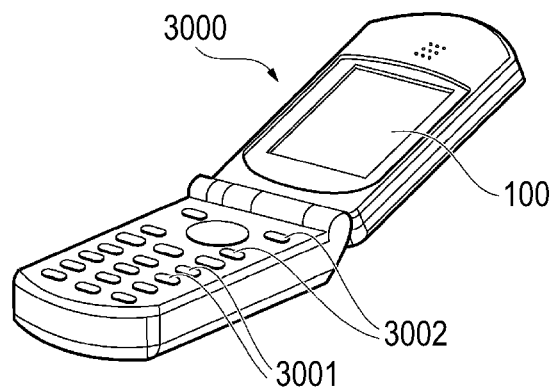
Figure 11C:
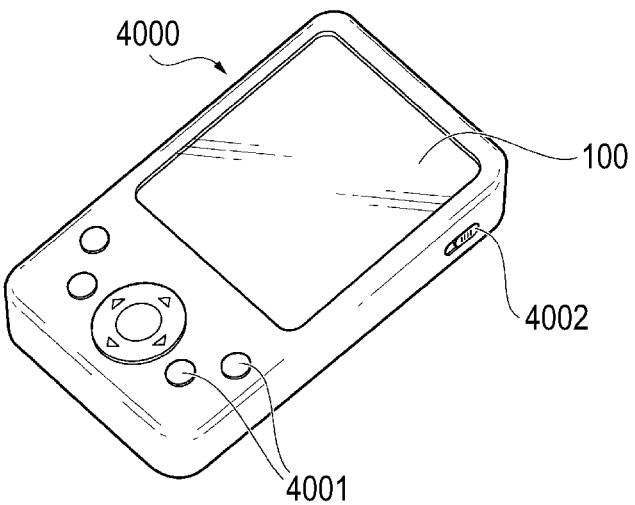

Next, an electronic apparatus to which the electro-optical device provided with an input function 100 according to the above-described embodiment is applied will be described. FIG. 11A represents the configuration of a mobile-type personal computer including the electro-optical apparatus provided with an input function 100. The personal computer 2000 includes the electro-optical apparatus provided with an input function 100 as a display unit and a main body unit 2010. In the main body unit 2010, a power switch 2001 and a keyboard 2002 are disposed. FIG. 11B represents the configuration of a cellular phone including the electro-optical apparatus provided with an input function 100. The cellular phone 3000 includes a plurality of operation buttons 3001, scroll buttons 3002, and the electro-optical apparatus provided with an input function 100 as a display unit. By operating the scroll buttons 3002, the screen displayed in the electro-optical apparatus provided with an input function 100 is scrolled. FIG. 11C represents the configuration of a personal digital assistant (PDA) to which the electro-optical apparatus provided with an input function 100 is applied. The personal digital assistant 4000 has a plurality of operation buttons 4001, a power switch 4002, and the electro-optical apparatus provided with an input function 100 as a display unit. When the power switch 4002 is operated, various types of information such as an address list or a schedule book are displayed in the electro-optical apparatus provided with an input function 100.

In addition, as examples of electronic apparatuses, to which the electro-optical apparatus provided with an input function 100 is applied, other than the electronic apparatuses shown in FIGS. 11A to 11C, there are electronic apparatuses such as a digital still camera, a liquid crystal television set, a view finder-type or monitor direct-viewing-type video cassette recorder, a car navigation system, a pager, an electronic organizer, a calculator, a word processor, a workstation, a television phone, a POS terminal, and a banking terminal. As a display unit of the above-described various electronic apparatuses, the above-described electro-optical apparatus provided with an input function 100 can be applied.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electrostatic capacitance-type input device comprising:
 a translucent input device substrate that has a translucent position detecting electrode and a position detecting mount terminal electrically connected to the position detecting electrode on a first face side;
 a flexible wiring substrate that includes an overlapping portion overlapping with the first face side of the input device substrate, wherein the flexible wiring substrate is electrically connected to the position detecting mount terminal in the overlapping portion; and
 a translucent shielding film that has a shield electrode layer, wherein the translucent shielding film is disposed to cover a second face side of the input device substrate, and wherein the translucent shielding film includes a main body portion that covers the second face of the input device substrate and an extension portion that extends from the main body portion, wherein the extension portion is folded back so as to overlap with the first face side of the input device substrate, and
 wherein the translucent shielding film is electrically connected to the flexible wiring substrate through the extension portion.

2. The electrostatic capacitance-type input device according to claim 1, wherein the shield electrode layer has sides facing the input device substrate and the flexible wiring substrate, and the shield electrode layer is exposed in the extension portion on the side of the flexible wiring substrate and
 wherein the flexible wiring substrate overlaps with the extension portion so as to be electrically connected to the shield electrode layer.

3. The electrostatic capacitance-type input device according to claim 2,
 wherein the shielding film includes an adhesive layer that bonds the shielding film to the second face side of the input device substrate, and
 wherein the extension portion is bonded to the first face side of the input device substrate by the adhesive layer.

4. The electrostatic capacitance-type input device according to claim 2,
 wherein the shielding film includes an insulating layer on a side of the shield electrode layer that is opposite to a side on which the input device substrate is positioned, and
 wherein, in the extension portion, the shield electrode layer is exposed in an area in which the insulating layer is not formed.

5. The electrostatic capacitance-type input device according to claim 1, wherein the shield electrode layer has sides facing the input device substrate and the flexible wiring substrate, and the shield electrode layer is exposed in the extension portion on the side of the input device substrate and
 wherein the input device substrate includes a shielding mount terminal that is electrically connected to both the shield electrode layer and the flexible wiring substrate.

6. The electrostatic capacitance-type input device according to claim 1,
 wherein an arrangement area of the position detecting mount terminal is placed between a pair of the extension portions of the shielding film.

7. The electrostatic capacitance-type input device according to claim 6, wherein a pair of the extension portions are overlapped on the first surface of the input device substrate, on both sides of the arrangement area of the position detecting mount terminal.

8. The electrostatic capacitance-type input device according to claim 1, wherein the input device substrate has a shielding mount terminal that is formed on both sides of the arrangement area of the position detecting mount terminal,
 wherein the extension portion overlaps a part of the shielding mount terminal to be electrically connected to the shielding mount terminal, and
 wherein the flexible wiring substrate is electrically connected to the shielding mount terminal in an area where the flexible wiring substrate and the extension portion have no overlapping area.

9. An electro-optical apparatus provided with an input function comprising:
 a translucent input device substrate that has a translucent position detecting electrode and a position detecting mount terminal electrically connected to the position detecting electrode on a first face side;
 a flexible wiring substrate that includes an overlapping portion overlapping with the first face side of the input device substrate, wherein the flexible wiring substrate is electrically connected to the position detecting mount terminal in the overlapping portion; and a translucent shielding film that has a shield electrode layer, wherein the translucent shielding film is disposed to cover a second face side of the input device substrate, wherein the shielding film includes a main body portion that covers the second face of the input device substrate and an extension portion that extends from the main body portion and that is folded back so as to overlap with the first face side of the input device substrate, wherein the shielding film is electrically connected to the flexible wiring substrate through the extension portion, and wherein an electro-optical panel for image generation is configured on a side of the input device substrate that is opposite to an input operation side.

* * * * *